US007719217B2

(12) United States Patent
Yokota et al.

(10) Patent No.: US 7,719,217 B2
(45) Date of Patent: May 18, 2010

(54) DRIVE DEVICE FOR A BRUSHLESS MOTOR

(75) Inventors: Youji Yokota, Kariya (JP); Azuma Kimura, Kariya (JP)

(73) Assignee: Denso Corporation, Kariya (JP)

( * ) Notice: Subject to any disclaimer, the term of this patent is extended or adjusted under 35 U.S.C. 154(b) by 338 days.

(21) Appl. No.: 12/029,881

(22) Filed: Feb. 12, 2008

(65) Prior Publication Data
US 2008/0211439 A1 Sep. 4, 2008

(30) Foreign Application Priority Data
Feb. 15, 2007 (JP) ............................. 2007-035139

(51) Int. Cl.
*H02H 7/08* (2006.01)
(52) U.S. Cl. ........................... 318/400.21; 318/400.22; 318/430; 318/490
(58) Field of Classification Search .......... 318/400.21, 318/400.22, 430, 432, 490, 254; 701/41
See application file for complete search history.

(56) References Cited

U.S. PATENT DOCUMENTS

| | | | |
|---|---|---|---|
| 5,132,604 A | | 7/1992 | Shimane et al. |
| 5,574,346 A | | 11/1996 | Chavan et al. |
| 5,694,010 A | | 12/1997 | Oomura et al. |
| 6,211,681 B1 * | | 4/2001 | Kagawa et al. ............... 324/426 |
| 6,469,461 B1 | | 10/2002 | Konda et al. |
| 6,749,269 B1 * | | 6/2004 | Niwa ............................ 303/20 |
| 6,805,094 B2 * | | 10/2004 | Hashimoto et al. ........... 123/396 |
| 2003/0100975 A1 * | | 5/2003 | Hashimoto et al. .............. 701/1 |
| 2003/0221668 A1 * | | 12/2003 | Hashimoto et al. ........... 123/396 |
| 2004/0054456 A1 * | | 3/2004 | Yoshida et al. ................ 701/41 |
| 2005/0135035 A1 * | | 6/2005 | Tsutsui ........................ 361/93.1 |
| 2005/0184688 A1 * | | 8/2005 | Hirochi et al. ............... 318/254 |
| 2005/0258792 A1 * | | 11/2005 | Matsuda et al. ............. 318/432 |
| 2006/0220607 A1 * | | 10/2006 | Imagawa et al. ............ 318/638 |

(Continued)

FOREIGN PATENT DOCUMENTS

JP          08-047296          2/1996

(Continued)

OTHER PUBLICATIONS

Japanese Office Action dated Feb. 10, 2009, issued in corresponding Japanese Application No. 2007-035139, with English translation.

(Continued)

*Primary Examiner*—Paul Ip
(74) *Attorney, Agent, or Firm*—Nixon & Vanderhye PC (57) ABSTRACT

A drive device for a brushless motor executes an abnormality diagnosis (disconnection/short-circuit) of a motor side circuit. In detecting abnormality of the motor side circuit, the drive device includes a terminal voltage monitor circuit that monitors a terminal voltage of an output terminal that is connected to a motor terminal of respective phases. A microcomputer starts abnormality diagnosis under a condition where the motor is stopped, and an object to be driven has normally operated at the time of driving the motor. For executing the abnormality diagnosis, the microcomputer turns on/off only a transistor of the drive circuit of one phase in a state where all of transistors are turned off, and acquires monitor signals to execute the abnormality diagnosis based on signal levels of the monitor signals.

12 Claims, 8 Drawing Sheets

U.S. PATENT DOCUMENTS

2008/0004773 A1* 1/2008 Maeda ..................... 701/41
2008/0017439 A1* 1/2008 Sawada et al. ............ 180/446

FOREIGN PATENT DOCUMENTS

| JP | 10-341590 | 12/1998 |
| JP | 11-008992 | 1/1999 |
| JP | 2005-354773 | 12/2005 |
| JP | 2006-050707 | 2/2006 |

OTHER PUBLICATIONS

Extended European Search Report dated Nov. 5, 2009, issued in corresponding European Application No. 08002752.7-1242.

* cited by examiner

| Tr1 (12U) | MOTOR SIDE CIRCUIT | TERMINAL POTENTIAL | | | MONITOR SIGNAL | | | ABNOR-MALITY |
|---|---|---|---|---|---|---|---|---|
| | | Drv-U | Drv-V | Drv-W | MONI-U | MONI-V | MONI-W | |
| ON | NORMAL | +B | +B | +B | L | L | L | — |
| | U=+B SHORT | +B | +B | +B | L | L | L | — |
| | V=+B SHORT | +B | +B | +B | L | L | L | — |
| | W=+B SHORT | +B | +B | +B | L | L | L | — |
| | U=GND SHORT | GND | GND | GND | H | H | H | YES |
| | V=GND SHORT | +B | GND | +B/2 | L | H | L | YES |
| | W=GND SHORT | +B | +B/2 | GND | L | L | H | YES |
| | U=OPEN | +B | GND | GND | L | H | H | YES |
| | V=OPEN | +B | GND | +B | L | H | L | YES |
| | W=OPEN | +B | +B | GND | L | L | H | YES |
| OFF | NORMAL | GND | GND | GND | H | H | H | — |
| | U=+B SHORT | +B | +B | +B | L | L | L | YES |
| | V=+B SHORT | +B | +B | +B | L | L | L | YES |
| | W=+B SHORT | +B | +B | +B | L | L | L | YES |
| | U=GND SHORT | GND | GND | GND | H | H | H | — |
| | V=GND SHORT | GND | GND | GND | H | H | H | — |
| | W=GND SHORT | GND | GND | GND | H | H | H | — |
| | U=OPEN | GND | GND | GND | H | H | H | — |
| | V=OPEN | GND | GND | GND | H | H | H | — |
| | W=OPEN | GND | GND | GND | H | H | H | — |

DRIVE DEVICE FOR A BRUSHLESS MOTOR

CROSS REFERENCE TO RELATED APPLICATION

This application relates to and incorporates herein by reference Japanese Patent Application No. 2007-35139 filed on Feb. 15, 2007.

FIELD OF THE INVENTION

The present invention relates to a drive device for a brushless motor having a function for detecting abnormality such as disconnection or short-circuit, which occurs inside a brushless motor or a power supply path thereof.

BACKGROUND OF THE INVENTION

A conventional drive device for a single-phase brushless motor has an H-bridge circuit and a diagnostic signal application circuit. The diagnostic signal application circuit applies one of motor terminals with a given voltage variation as a diagnostic signal in order to detect abnormality such as disconnection or short-circuit, which occurs inside a motor or a power supply path-thereof (for example, JP 8-47296A).

In this drive device, after all of switching elements of the H-bridge circuit are turned off, one of the motor terminals is supplied with the diagnostic signal from the diagnostic signal application circuit. In this situation, a reply signal that occurs in another motor terminal is detected, and the detected reply signal and the diagnostic signal are compared with each other, thereby detecting the abnormality of a motor side circuit.

According to the above proposed drive device, since the abnormality inside the motor or the power supply path can be automatically detected, an object to be driven which is connected to a motor shaft of the brushless motor can be safely operated.

However, in conducting abnormality diagnosis, because it is necessary to provide the application circuit that applies the diagnostic signal within the drive device of the brushless motor, the drive device cannot be downsized, and the costs increase.

Also, in the above proposed drive device, the abnormality diagnosis starts after all of the switching elements in the H-bridge circuit are turned off. However, the motor shaft may rotate by a force that is exerted on the motor shaft from the object to be driven or external vibrations by just turning off the switching element of the H-bridge circuit.

When the motor shaft rotates in this way, an electromotive force is developed in the motor. As a result, the above proposed drive device may not precisely conduct the abnormality diagnosis by the electromotive force.

SUMMARY OF THE INVENTION

It is therefore an object of the present invention to provide a drive device for a brushless motor, which realizes an abnormality diagnosis function that detects the abnormality occurring inside a motor or a power supply path thereof, and which enhances a precision in the abnormality diagnosis.

According to the present invention, a plurality of drive circuits is connected to a plurality of motor terminals of a brushless motor, respectively. Each drive circuit has a pair of switching elements that connects a power supply line of a DC power supply and a ground line to the motor terminals, respectively. Abnormality diagnosis of a motor side circuit is executed based on a signal level of terminal voltages produced at the motor terminals by applying a voltage to one of the motor terminals after turning off the switching elements.

In one aspect, the voltage is applied by turning on the switch element on a power supply line side that is disposed in one of the plurality of drive circuits, and the terminal voltages of the respective motor terminals are taken in from the respective terminals as high or low level signals.

In another aspect, it is checked whether the brushless motor has stopped rotating based on a detection signal of the rotation sensor, and the abnormality diagnosis is performed, when it is determined that the brushless motor has stopped rotating.

In a further aspect, it is checked whether an object to be driven by the brushless motor has operated normally at the time of driving the brushless motor, and the abnormality diagnosis is performed, when it is determined that the object to be driven has operated normally.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
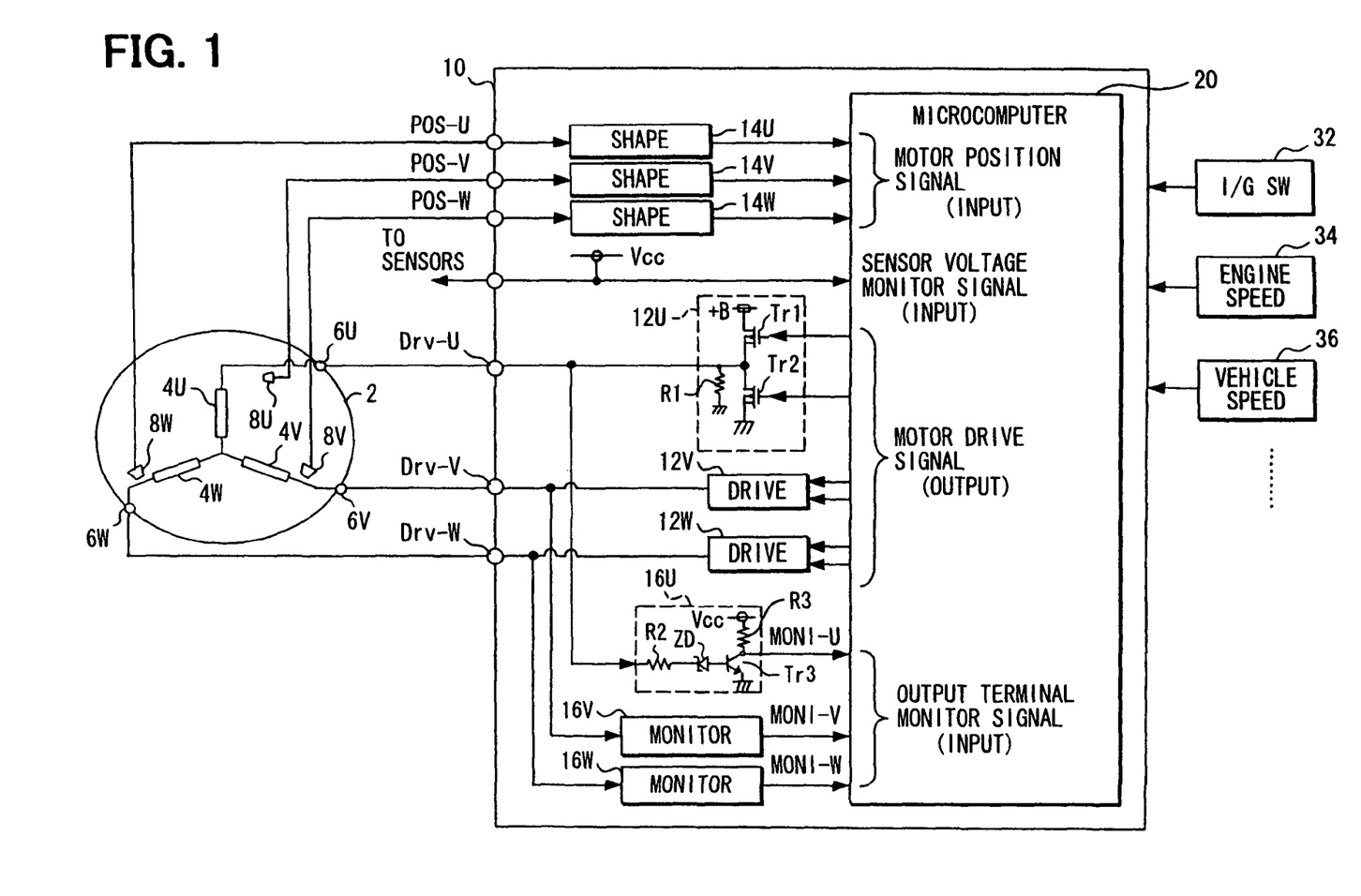
FIG. 1 is a block diagram showing a drive device for a brushless motor according to an embodiment of the present invention.

Referring first to FIG. 1, a drive device for a brushless motor is incorporated into a control unit 10 that controls a vehicle engine (not shown), and has three drive circuits 12U, 12V and 12W in correspondence with three motor terminals 6U, 6V and 6W, which are connected to motor windings 4U, 4V and 4W of the respective phases within a three-phase brushless motor 2. The motor windings 4U, 4V and 4W are star-connected, that is, Y-connected. This brushless motor 2 is used to drive an exhaust gas recirculation (EGR) valve of an engine (not shown).

Each of the drive circuits 12U, 12V and 12W includes a pair of transistors Tr1 and Tr2 that are connected in series between a power supply line to which a positive supply voltage +B is applied from a positive side of an in-vehicle battery (not shown), and a ground line having the same potential as that at the negative pole side of the in-vehicle battery.

The connection point of those two transistors Tr1 and Tr2 is connected to the motor terminal 6U, 6V or 6W of the three-phase brushless motor 2 through an output terminal Drv-U, Drv-V or Drv-W disposed in the control unit 10, and a signal line, correspondingly. The transistors Tr1 and Tr2 are switching elements such as MOSFETs.

Thus, each of the drive circuits 12U, 12V and 12W functions as a half-bridge circuit that allows an electric current to flow into the corresponding motor terminals 6U, 6V and 6W, when the transistor Tr1 is turned on and the transistor Tr2 is turned off. Further each allows a current to flow out of the corresponding motor terminals 6U, 6V and 6W, when the transistor Tr1 is turned off and the transistor Tr2 is turned on.

A resistor R1 that grounds the connection point between the respective transistors Tr1 and Tr2 to the ground line is disposed in each of the drive circuits 12U, 12V and 12W. The resistor R1 is a potential fixing resistor for preventing the potential from being not fixed by permitting the connection point to be in a floating state when both of the two transistors Tr1 and Tr2 are turned off.

Further, there are provided terminal monitor circuits 16U, 16V and 16W that detect the potentials of the output terminals Drv-U, Drv-V and Drv-W, which are connected to the respective motor terminals 6U, 6V and 6W of the three-phase brushless motor 2 through respective signal lines.

Each of the terminal monitor circuits 16U, 16V and 16W is made up of a bipolar transistor Tr3 whose emitter is grounded, a resistor R3 that applies a power supply Vcc that is developed within the control unit 10 to the collector of the transistor Tr3, and a series circuit of a resistor R2 and a Zener diode ZD which connect the output terminal Drv-U, Drv-V or Drv-W to the base of the transistor Tr3.

Thus, monitor signals MONI-U, MONI-V and MONI-W are generated from the terminal monitor circuits 16U, 16V and 16W. The monitor signals MONI-U, MONI-V and MONI-W become low in signal level, when the terminal voltage of the output terminals Drv-U, Drv-V and Drv-W is higher than a threshold voltage that is determined according to the breakdown voltage of the zener diode ZD. The monitor signals become high, when the terminal voltage is equal to or lower than the threshold voltage.

The monitor signals MONI-U, MONI-V and MONI-W are input to a microcomputer 20 that controls various devices of the engine including the three-phase brushless motor 2. The microcomputer 20 is used to also detect the abnormality of the motor side circuit, more specifically, a signal line that connects the inside of the three-phase brushless motor 2 or the three-phase brushless motor 2 to the control unit 10).

The three-phase brushless motor 2 is equipped with three rotational position sensors 8U, 8V and 8W that detects the rotational positions of a rotor, and the control unit 10 is equipped with waveform shaping circuits 14U, 14V and 14W that shape the waveforms of the output signals (rotational position signals) POS-U, POS-V and POS-W from those respective rotational position sensors 8U, 8V and 8W, and input the shaped signals to the microcomputer 20.

The control unit 10 applies a supply voltage Vcc that is developed internally to the respective rotational position sensors 8U, 8V and 8W as an operating power supply. The microcomputer 20 is input with the supply voltage Vcc that is applied to the rotational position sensors 8U, 8V and 8W as a monitor signal. This is because the microcomputer 20 side is allowed to determine whether the power supply Vcc is normally applied to the rotational position sensors 8U, 8V and 8W, that is, whether the rotational position sensors 8S, 8V and 8W normally operate or not.

Figure 2:
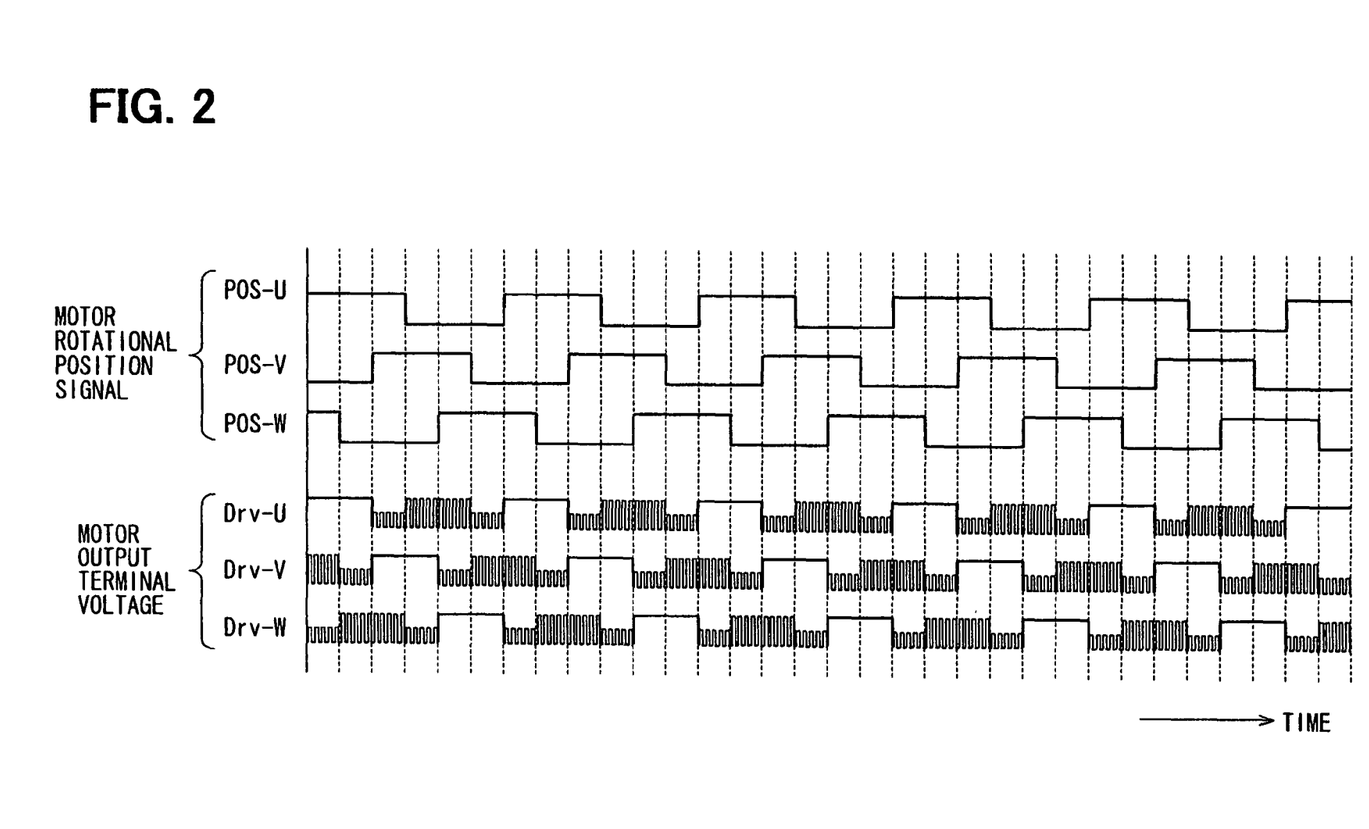
FIG. 2 is a timing diagram showing a change in a rotational position signal and an output terminal voltage when a motor is driven.

As shown in FIG. 2, the microcomputer 20 calculates the position of the rotor of the three-phase brushless motor 2 based on the rotational position signals POS-U, POS-V and POS-W that are input from the waveform shaping circuits 14U, 14V and 14W. The microcomputer 20 turns on the high side switches (that is, the transistor Tr1) within the drive circuits 12U, 12V and 12W according to the position and the rotational direction of the rotor sequentially, and duty-drives the low side switches (that is, the transistor Tr2) within other drive circuits sequentially, thereby controlling the rotation of the three-phase brushless motor 2.

The rotational position signals POS-U, POS-V and POS-W, which are shaped in waveform by the waveform shaping circuits 14U, 14V and 14W, are changed as shown in FIG. 2 when the microcomputer 20 rotates the three-phase brushless motor 2. The voltages of the output terminals Drv-U, Drv-V and Drv-W, are controlled through the drive circuits 12U, 12V and 12W as shown in FIG. 2. This driving method of the three-phase brushless motor 2 is known.

Further, the microcomputer 20 controls the driving of the three-phase brushless motor 2, when the driving of the EGR valve is required under the engine control, and the driving quantity changes according to the engine state. Therefore, the microcomputer 20 calculates an EGR quantity, and therefore the control quantity of the three-phase brushless motor 2 based on an input signal from an engine control switch and sensors (ignition switch 32, an engine rotation speed sensor 34, a vehicle travel speed sensor 36, etc.) which are connected to the control unit 10. The microcomputer 20 turns on/off the transistors Tr1 and Tr2 of the drive circuits 12U, 12V and 12W based on the control quantity to rotate the three-phase brushless motor 2.

The microcomputer is programmed to also execute an abnormality diagnosing process to detect an abnormality of the motor side circuit in the drive device according to this embodiment.

First, when the microcomputer 20 diagnoses the abnormality of the motor side circuit, the microcomputer 20 turns on/off the transistor Tr1 at the power supply line side which is disposed on one of the drive circuits (more specifically, the drive circuit 12U that is connected to the U-phase motor terminal 6U) after confirming that the rotation of the three-phase brushless motor 2 has stopped.

A time for turning on the transistor Tr1 of the drive circuit 12U in order to conduct the abnormality diagnosis is set to a time period, with which the three-phase brushless motor 2 does not rotate, even if the V-phase or W-phase motor side circuit is short-circuited to the ground line side and a current flows in the motor winding 4U and the motor winding 4V or 4W.

When the transistor Tr1 is turned on and off, the microcomputer 20 takes in the monitor signals MONI-U, MONI-V and MONI-W of the terminal voltages at the respective output terminals Drv-U, Drv-V and Drv-W from the terminal monitor circuits 16U, 16V and 16W, respectively. The microcomputer 20 checks whether there occurs the abnormality such as disconnection (open circuit), short-circuit to the ground line (GND short-circuit), or short-circuit (+B short-circuit) to the power supply line in the respective phases of the three-phase brushless motor 2 based on the voltage level.

Figure 3:
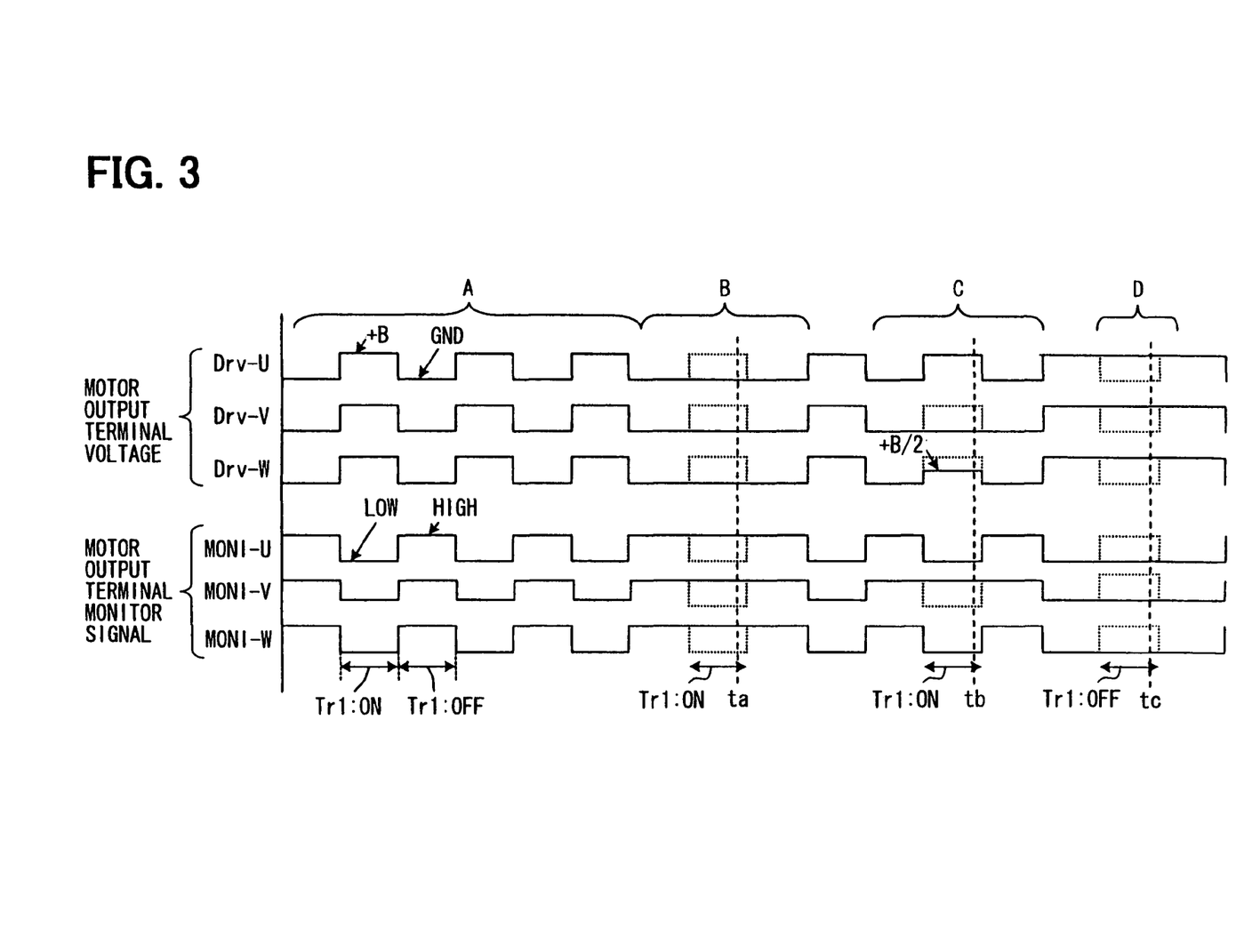
FIG. 3 is a timing diagram showing a relationship between an output terminal voltage and a monitor signal which occur at the time of abnormality determination.

That is, in the case where the microcomputer 20 turns on/off the transistor Tr1 of the drive circuit 12U as described above, when no abnormality occurs in the motor side circuit, the terminal voltage at the output terminal Drv-U, Drv-V and Drv-W becomes supply potential +B when the transistor Tr1 is turned on, and becomes the ground potential GND when the transistor Tr1 is turned off, as indicated by a range A in FIG. 3.

The terminal monitor circuits 16U, 16V and 16W output the monitor signals MONI-U, MONI-V and MONI-W which become low when the terminal voltage of the output terminals Drv-U, Drv-V and Drv-W is higher than the threshold voltage, and becomes high when the terminal voltage is equal to or lower than the threshold voltage. Therefore, the monitor signals MONI-U, MONI-V and MONI-W which are input to the microcomputer 20 from the respective terminal monitor circuits 16U, 16V and 16W become low when the transistor Tr1 is turned on, and becomes high when the transistor Tr1 is turned off.

The terminal voltage at the output terminal Drv-U, Drv-V and Drv-W becomes the ground potential GND when the transistor Tr1 is turned off is, because the resistor R1 is disposed in the respective drive circuits 12U, 12V and 12W.

Figure 4:
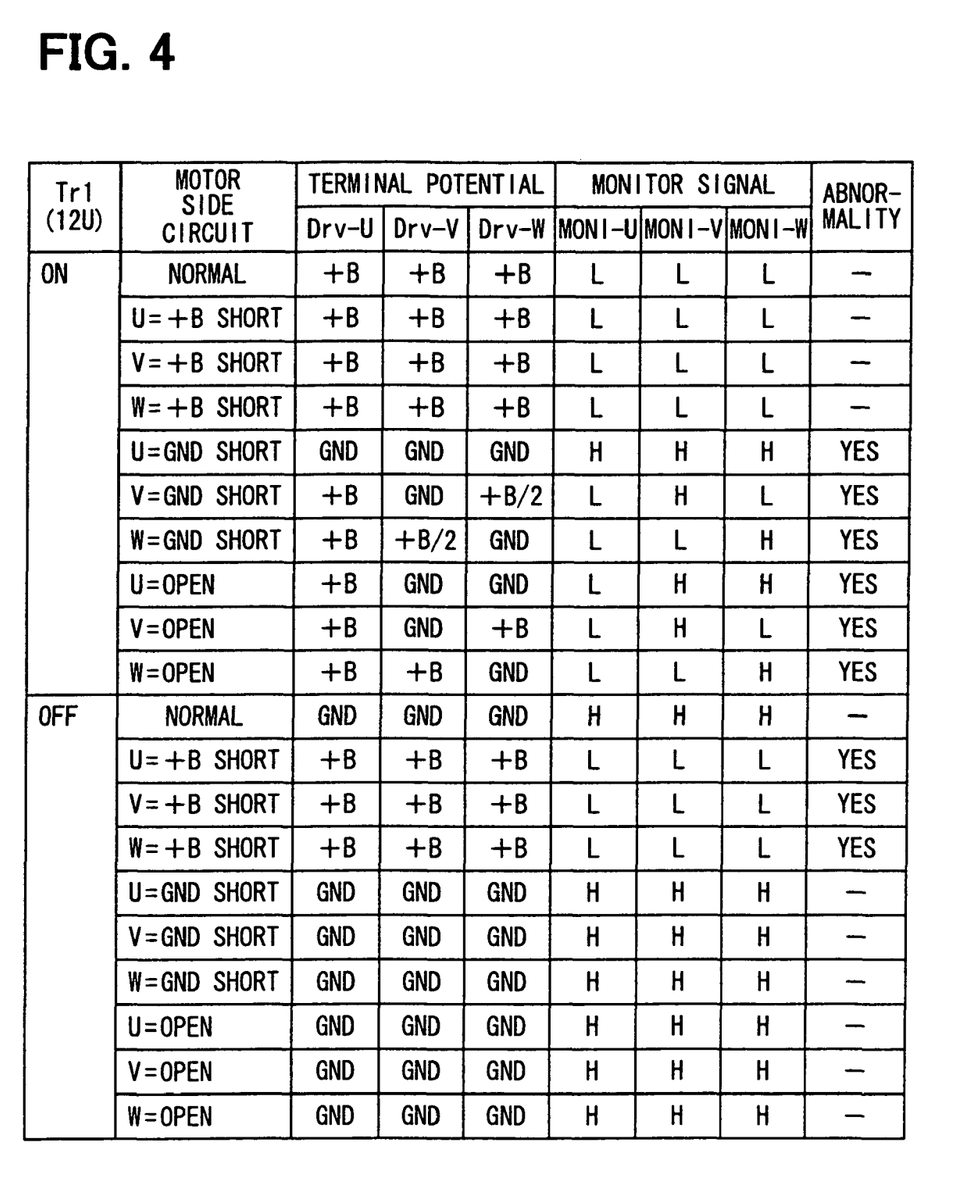
FIG. 4 is a table showing abnormality diagnosis operation conducted by a microcomputer.

On the contrary, when an abnormality occurs in the respective phase circuits of the motor which are connected to the respective output terminals Drv-U, Drv-V and Drv-W, any one of the terminal voltages at the output terminals Drv-U, Drv-V and Drv-W becomes a voltage different from that in a normal state, and the monitor signals MONI-U, MONI-V and MONI-W that are input to the microcomputer 20 from the terminal monitor circuits 16U, 16V and 16W also become a voltage level different from that in the normal state, as shown in a table of FIG. 4.

That is, when the U-phase motor side circuit that is connected to the output terminal Drv-U is short-circuited to GND, the output terminal Drv-U is held by the ground potential GND as indicated by a range B in FIG. 3. Therefore, other output terminals Drv-V and Drv-W also become the ground potential GND. For this reason, when the transistor Tr1 is turned on, all of the monitor signals MONI-U, MONI-V and MONI-W, which are input to the microcomputer 20 from the terminal monitor circuits 16U, 16V and 16W, become high level, which is different from that in the normal state.

Also, in the case where the V-phase motor side circuit that is connected to the output terminal Drv-V is short-circuited to GND, the output terminal Drv-V is held by the ground potential GND as indicated by a range C in FIG. 3. Therefore, when the transistor Tr1 is turned on, the monitor signal MONI-V, which is input to the microcomputer 20 from the terminal monitor circuit 16V, becomes high, which is different from that in the normal state.

In this case, when the transistor Tr1 becomes ON, a current flows in the V-phase (GND short-circuit portion) from the U phase of the three-phase brushless motor 2. As a result, a voltage "+B/2" provided by dividing the supply voltage +B by the resistant component of the motor windings 4U and 4V into substantially ½ is developed in the output terminal Drv-W of the W-phase.

For this reason, in the case where the threshold voltage of the drive circuit 12W is set to be higher than the voltage "+B/2", when the V-phase motor side circuit is short-circuited to GND, the monitor signal MONI-W that is input to the microcomputer 20 from the terminal monitor circuit 16W can be high level that is different from that in the normal state when the transistor Tr1 is ON.

In this embodiment, the threshold voltage of the respective drive circuits 12U, 12V and 12W is set to be lower than the voltage "+B/2." Therefore the monitor signal MONI-V that is input to the microcomputer 20 from the terminal monitor circuit 16V becomes low level that is identical with that in the normal state when the transistor Tr1 is turned on.

In the case where the W-phase motor side circuit that is connected to the output terminal Drv-W is short-circuited to GND, the output terminal Drv-W is held by the ground potential GND. Therefore, when the transistor Tr1 is turned on, the monitor signal MONI-W which is input to the microcomputer 20 from the terminal monitor circuit 16W becomes high level which is different from that in the normal state (FIG. 4).

Accordingly, in the case where the GND short-circuit occurs in any phase of the motor side circuit, when the transistor Tr1 of the drive circuit 12U is ON, the monitor signals MONI-U, MONI-V and MONI-W are read from the respective terminal monitor circuits 16U, 16V and 16W at given time points ta and tb shown in FIG. 3, thereby making it possible to detect the abnormality.

On the other hand, in the case where +B short-circuit occurs in any phase of the motor side circuit, all of the output terminals Drv-U, Drv-V and Drv-W become the supply voltage +B, as indicated by a range D in FIG. 3. For this reason, in this state, all of the monitor signals MONI-U, MONI-V and MONI-W, which are input to the microcomputer 20 from the terminal monitor circuits 16U, 16V and 16W, become low level that is different from that in the normal state when the transistor Tr1 is OFF.

Accordingly, in the case where the +B short-circuit occurs in any phase of the motor side circuit, when the transistor Tr1 of the drive circuit 12U is OFF, the monitor signals MONI-U, MONI-V and MONI-W are read from the respective terminal monitor circuits 16U, 16V and 16W at a given time point tc shown in FIG. 3, thereby making it possible to detect the abnormality.

Also, in the case where the U-phase motor side circuit is disconnected (open), even if the transistor Tr1 is ON, the supply voltage +B is not applied to the V-phase and the W-phase. Therefore, when the transistor Tr1 is ON, the monitor signals MONI-V and MONI-W that are input to the microcomputer 20 from the terminal monitor circuits 16V and 16W become high level that is different from that in the normal state (refer to FIG. 4).

Also, in the case where the V-phase or W-phase motor side circuit is disconnected (open), even if the transistor Tr1 is ON, the supply voltage +B is not applied to the V-phase or W-phase output terminal Drv-V or Drv-W. Therefore, when the transistor Tr1 is ON, the monitor signal MONI-V or MONI-W which is input to the microcomputer 20 from the terminal monitor circuit 16V or 16W becomes high level that is different from that in the normal state (FIG. 4).

Accordingly, in the case where the disconnection (open) occurs in any phase of the motor side circuit, when the transistor Tr1 of the drive circuit 12U is ON, the monitor signals MONI-U, MONI-V and MONI-W are read from the respective terminal monitor circuits 16U, 16V and 16W at given time points ta and tb shown in FIG. 3, thereby making it possible to detect the abnormality, as in the case of the GND short-circuit.

As described above, in the drive device according to this embodiment, the microcomputer 20 turns on and off the transistor Tr1 within the drive circuit 12U, and takes in the monitor signals MONI-U, MONI-V and MONI-W from the terminal monitor circuits 16U, 16V and 16W, and conducts the abnormality diagnosis of the motor side circuit from the signal levels. The abnormality diagnosing process that is actually executed by the microcomputer 20 will be described in detail with reference to flowcharts shown in FIGS. 5 to 8.

Figure 5:
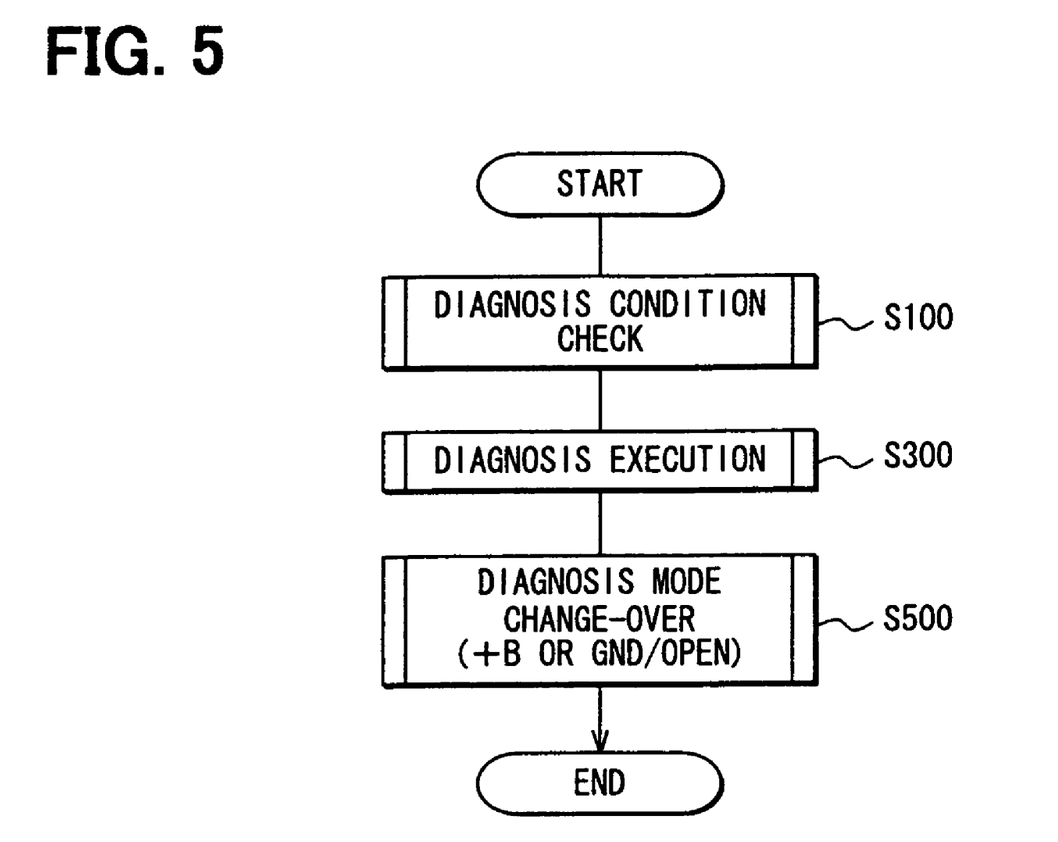
FIG. 5 is a flowchart showing an abnormality diagnosing process that is executed by the microcomputer.

First, as shown in FIG. 5, the microcomputer 20 executes the abnormality diagnosing process. This abnormality diagnosing process is repetitively executed until the abnormality diagnosis is completed after the microcomputer 20 starts. When the process starts, the microcomputer 20 first executes the diagnosis condition checking process that checks whether the execution condition (diagnosis condition) of the abnormality diagnosis is satisfied in S100.

Upon completion of the diagnosis condition checking process, the microcomputer 20 executes the diagnosing process that actually conducts the abnormality diagnosis based on the determination results of the diagnosis condition in S300, and finally executes a diagnosis mode changing process that alternately changes over the diagnosis mode to a +B diagnosis mode and a GND/OPEN diagnosis mode in S500. Then, the microcomputer 20 again repeats the processing to S100.

The +B diagnosis mode is a diagnosis mode that turns off the transistor Tr1 of the drive circuit 12U and detects the +B short-circuit. The GND/OPEN diagnosis mode is a diagnosis mode that turns on the transistor Tr1 of the drive circuit 12U and detects the GND short-circuit or disconnection (open circuit).

Figure 6:
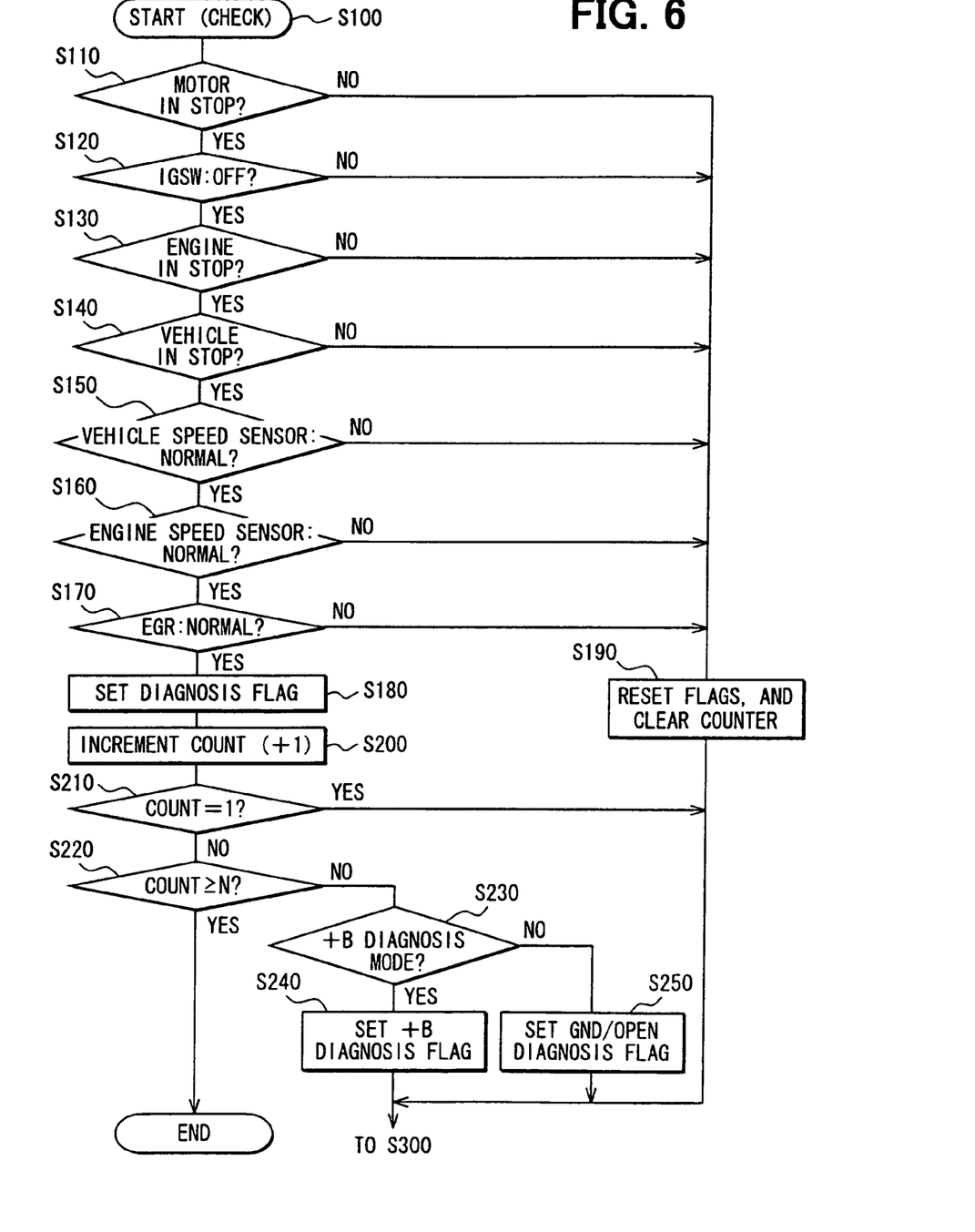
FIG. 6 is a flowchart showing a diagnosis condition checking process that is executed in the abnormality diagnosing process in FIG. 5.

As shown in FIG. 6 (diagnosis condition checking process), the microcomputer 20 first checks whether the three-phase brushless motor 2 is in a stop condition (not rotating) based on the rotational position signals POS-U, POS-V and POS-W, which are input through the waveform shaping circuits 14U, 14V and 14W, in S110.

Then, in the case where it is determined that the three-phase brushless motor 2 has stopped, the processing is shifted to S120, and the microprocessor 20 checks whether the ignition switch (IGSW) 32 is OFF. When the ignition switch (IGSW) 32 is OFF, the processing is shifted to S130, and the microprocessor 20 checks whether the engine is in a stop condition based on a detection signal from the rotation speed sensor 34. When the engine has stopped, the processing is shifted to S140, and the microprocessor 20 checks whether a vehicle has stopped, or not, based on a detection signal from the vehicle speed sensor 36. Through the above procedure, the microcomputer 20 checks whether the vehicle has completely stopped, or not.

Subsequently, in the case where it is determined that the vehicle has stopped, the processing is shifted to S150, and the microcomputer 20 checks whether the vehicle speed sensor 36 normally operates. When the vehicle speed sensor 36 normally operates, the processing is shifted to S160, and the microcomputer 20 checks whether the supply voltage that is output to the rotational position sensors 8U, 8V and 8W is normal, that is, whether the rotational position sensors 8U, 8V and 8W normally operate based on a sensor voltage monitor signal.

That is, in S140 and S150, it is determined whether the rotational position sensors 8U, 8V and 8W, and the vehicle speed sensor 36, which are used to determine that the three-phase brushless motor 2 has stopped to rotate and the vehicle has stopped to travel, normally operate, with the result that it is checked whether the determination results in S110 and S140 are normal. The determination of the normality/abnormality of the vehicle speed sensor 36 is conducted, for example, based on the diagnosis results that are obtained by the abnormality diagnosis of the vehicle speed sensor 36 which is executed by the microcomputer 20, separately.

Then, if it is determined that the rotational position sensors 8U, 8V and 8W normally operate in S160, the processing is shifted to S170, and the microcomputer 20 checks whether the EGR valve that is an object to be driven by the three-phase brushless motor 2 normally operates, when the three-phase brushless motor 2 is driven (that is, when the EGR control is executed).

Then, when it is determined in S170 that that EGR valve that is an object to be driven by the three-phase brushless motor 2 normally operates, the execution condition of the abnormality diagnosis is satisfied, and the processing is shifted to S180 in which a diagnosis permission flag is set.

On the other hand, when it is determined through the processing of S110 to S170 that the rotation of the three-phase brushless motor 2, the on-state of the ignition switch (IGSW) 32, the rotation of the engine, the travel of the vehicle, the abnormality of the vehicle speed sensor 36, the abnormality of the supply voltage of the rotational position sensors 8U, 8V and 8W, or the operation failure of the EGR valve is determined, it is determined that the execution condition of the abnormality diagnosis is not satisfied, and the processing is shifted to S190.

In S190, the diagnosis permission flag, a +B diagnosis execution flag, and a GND/OPEN diagnosis execution flay are reset, a count of a counter that counts the number of abnormality diagnosis is cleared, and the processing is shifted to the diagnosing process of S300.

Then, when the diagnosis permission flag is set in S180, the count is incremented (+1) in S200, and the processing is shifted to S210, and the microcomputer 20 checks whether the count is 1, that is, whether the present time is immediately after the execution condition of the abnormality diagnosis has been satisfied.

In the case where it is determined that the count is 1 in S210, the present processing is terminated once, and the processing is shifted to the diagnosing process of S300 so that the initial diagnosis mode should be set in S500. Conversely, in the case where it is determined that the value of the counter is not 1 in S210, the microcomputer 20 checks whether the value of the counter reaches a predetermined upper limit value N in S220.

Then, when the value of the counter reaches the upper limit value N, since the abnormality diagnosis can be executed continuously a given number of times (N-2) or more, the abnormality diagnosing process is terminated. On the contrary, when the value of the counter does not reach the upper limit value N, the processing is shifted to S230, and the microcomputer 20 checks whether the present diagnosis mode is +B diagnosis mode or not (the GND/OPEN diagnosis mode).

If it is determined that the present diagnosis mode is +B diagnosis mode in S230, the processing is shifted to the diagnosing process of S300 after the +B diagnosis execution flag has been set in S240. On the contrary, if it is determined that the present diagnosis mode is the GND/OPEN diagnosis mode in S230, the processing is shifted to the diagnosing process of S300 after the GND/OPEN diagnosis execution flag has been set in S250. In S240 and S250, when the +B diagnosis execution flag or the END/OPEN diagnosis execution flag is set, the other diagnosis execution flag is reset.

Figure 7:
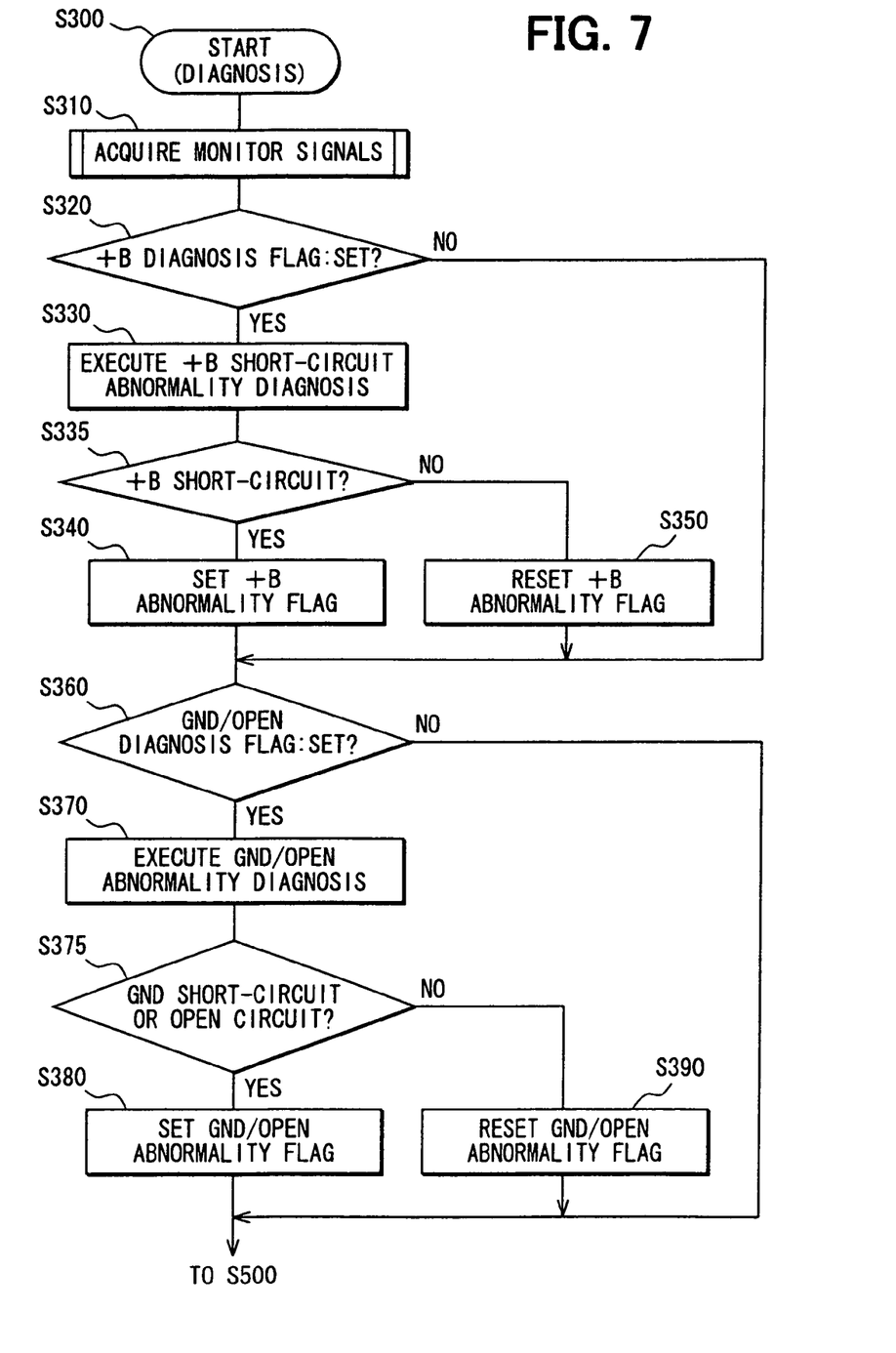
FIG. 7 is a flowchart showing a diagnosing process that is executed in the abnormality diagnosing process in FIG. 5.

In the diagnosis execution process S300 shown in FIG. 5, as shown in FIG. 7, the monitor signals MONI-U, MONI-V and MONI-W are first acquired from the terminal monitor circuits 16U, 16V and 16W in S310.

Subsequently, the microprocessor 20 checks whether the +B diagnosis execution flag has been set in S320. When the +B diagnosis execution flag has not been set, the processing is shifted to S360, and the microprocessor 20 checks whether the GND/OPEN diagnosis execution flag has been set. When the GND/OPEN diagnosis execution flag has not been set, the diagnosing process is terminated, and the processing is shifted to the diagnosis mode changing process of S500, which is shown in detail in FIG. 8.

On the other hand, when it is determined in S320 that the +B diagnosis execution flag has been set, the processing is shifted to S330, and the microprocessor 20 executes the +B short-circuit abnormality diagnosis by checking whether the monitor signals MONI-U, MONI-V and MONI-W that are obtained in S310 become the signal level (that is, low level) at the time of the +B short-circuit shown in FIG. 4. Subsequently, the microprocessor 20 checks whether the +B short-circuit is detected as a result of the abnormality diagnosis in S335.

The +B abnormality diagnosis needs to be executed in a state where all of the transistors Tr1 and Tr2 within the drive circuits 12U, 12V and 12W are OFF. For this reason, in the diagnosis mode charging process of S500, when the +B diagnosis mode is set, all of the transistors Tr1 and Tr2 within the drive circuits 12U, 12V and 12W are turned off at the same time.

Then, if it is determined that the +B short-circuit is detected in S335, the processing is shifted to S340, and the microprocessor 20 sets the +B abnormality flag to store the fact that the +B short-circuit occurs in the motor side circuit, and the processing is shifted to S360. Also, if it is determined that the +B short-circuit is not detected in S335, the processing is shifted to S350, and the microprocessor 20 resets the +B abnormality flag to store the fact that the +B short-circuit does not occur (that is, normal) in the motor side circuit, and the processing is shifted to S360.

If it is determined in S360 that the GND/OPEN diagnosis execution flag has been set, the processing is shifted to S370, and the microprocessor 20 checks whether all or a part of the monitor signals MONI-U, MONI-V and MONI-W that are acquired in S310 become the signal level (that is, high level) at the time of the GND short-circuit or disconnection (open) shown in FIG. 4 to thereby conduct the abnormality diagnosis of the GND short-circuit or disconnection (open). Subsequently, the microprocessor 20 checks whether the GND short-circuit or the disconnection (open) is detected as a result of the abnormality diagnosis in S375.

The GND/OPEN abnormality diagnosis needs to be executed in a state where only the power supply line side transistor Tr1 within the drive circuit 12U is ON, and all of other transistors Tr1 and Tr2 are OFF. For this reason, in the diagnosis mode changing process of S500, when the GND/OPEN diagnosis mode is set, the transistor Tr1 within the drive circuit 12U is turned on, and all of other transistors Tr1 and Tr2 are turned off at the same time.

If it is determined that the GND short-circuit or the disconnection (open) is detected in S375, the processing is shifted to S380, and the microprocessor 20 sets the GND/OPEN abnormality flag to store the fact that the GND short-circuit or disconnection (open) occurs in the motor side circuit, and the processing is shifted to S360. Also, if it is determined that the GND short-circuit or disconnection (open) is detected in S375, the processing is shifted to S390, and the microprocessor 20 resets the GND/OPEN abnormality flag to store the fact that the GND short-circuit or disconnection (open) does not occur (that is, normal) in the motor side circuit, and the processing is shifted to S500 shown in FIG. 8 in detail.

Figure 8:
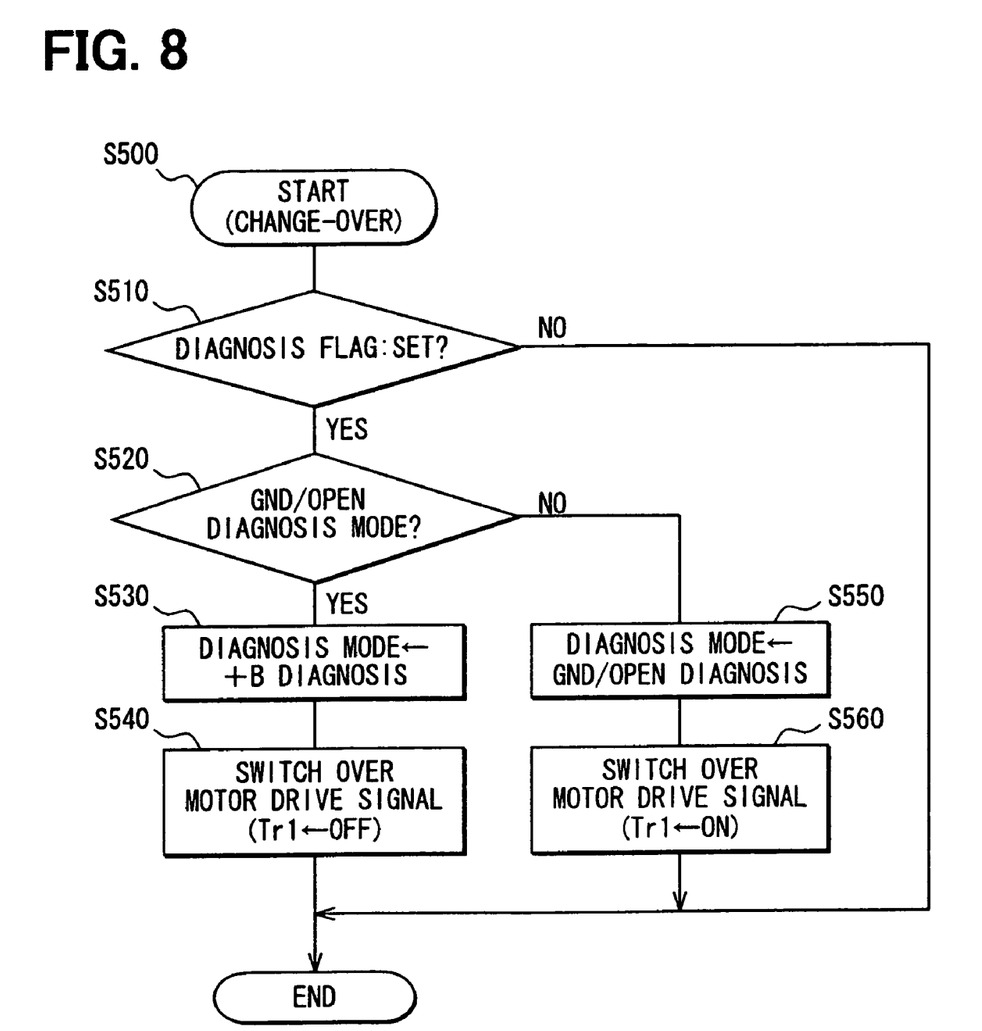
FIG. 8 is a flowchart showing a diagnosis mode changing process that is executed in the abnormality diagnosing process in FIG. 5.

In the diagnosis mode changing process S500, as shown in FIG. 8, the microcomputer 20 first checks in S510 whether the diagnosis permission flag is set. If the diagnosis permission flag is not set, the execution condition of the abnormality diagnosis is not satisfied with the result that the diagnosis mode changing process is terminated, and the processing is shifted to the diagnosis condition checking process of S100 again.

If it is determined that the diagnosis permission flag is set, the processing is shifted to S520, and the microcomputer 20 checks whether the presently set diagnosis mode is the GND/OPEN diagnosis mode.

If the presently set diagnosis mode is the GND/OPEN diagnosis mode, the processing is shifted to S530, and the diagnosis mode is changed over to the +B diagnosis mode. Further, after the motor drive signals that are output to the respective drive circuits 12U, 12V and 12W are switched over to the drive signals that allow all of the transistors Tr1 and tr2 to be turned off in S540, the processing is shifted to the diagnosis condition checking process S100.

Also, if it is determined in S520 that the presently set diagnosis mode is the +B diagnosis mode, the processing is shifted to S550, and the diagnosis mode is changed over to the GND/OPEN diagnosis mode. Further, after the motor drive signals that are output to the respective drive circuits 12U, 12V and 12W are switched over to the drive signals that allow only the transistor Tr1 within the drive circuit 12U to be turned on, and allow all of the other transistors Tr1 and tr2 to be turned off in S560, the processing is shifted to the diagnosis condition checking process.

As described above, in order to detect the abnormality such as the disconnection/short-circuit which occurs within the three-phase brushless motor 2 or in the power supply path, the drive device for the three-phase brushless motor 2 is equipped with the terminal monitor circuits 16U, 16V and 16W that monitor the terminal voltages of the output terminals Drv-U, Drv-V and Drv-W which are connected to the motor terminals 6U, 6V and 6W of the three-phase brushless motor 2.

The microcomputer 20 determines the rotation stop of the three-phase brushless motor 2, the stop of the vehicle, and the operation state of the object to be driven (EGR valve) by the three-phase brushless motor 2 through the diagnosis condition checking process to determine whether the execution condition of the abnormality diagnosis is satisfied. If the abnormality diagnosis condition is satisfied, the microcomputer 20 sets the diagnosis mode and the ON/OFF state of the transistors Tr1 and Tr2 within the drive circuits 12U, 12V and 12W through the diagnosis mode changing process, and conducts the abnormality diagnosis of the motor side circuit based on the monitor signals MONI-U, MONI-V and MONI-W from the terminal monitor circuits 16U, 16V and 16W through the diagnosing process.

For this reason, when the three-phase brushless motor 2 rotates, or when there is the possibility that the three-phase brushless motor 2 rotates due to the EGR valve that is an object to be driven or a force exerted from the vehicle side, the execution of the abnormality diagnosis can be stopped, and the abnormality diagnosis can be precisely executed without being affected by the electromotive force that is developed by the rotation of the motor shaft.

Also, at the time of conducting the abnormality diagnosis of the motor side circuit, an abnormality diagnosis voltage is applied to the motor terminal 6U of the U-phase which is connected to the output terminal Drv-U. The supply voltage +B is used as the abnormality diagnosis voltage, and the power supply line side transistor Tr1 of the U-phase drive circuit 12U is turned on to apply the supply voltage +Bwo to the U-phase motor terminal 6U from the output terminal Drv-U. As a result, it is unnecessary to additionally provide the diagnosis signal application circuit as in the conventional art, and the device configuration is simplified so that the drive device (control unit 10) can be downsized and reduced in the costs.

Since the three-phase winding 4U, 4V and 4W are star-connected (Y-connected), it is possible to detect the motor terminal voltages as high or low level (ON or OFF) signals and perform the abnormality detection based on the signals levels. It is noted that the motor terminal voltages must be checked with three signal levels, in the case of a brushless motor of three-connected windings.

The terminal monitor circuits 16U, 16V and 16W operate as terminal voltage detecting means, the diagnosis condition checking process that is executed by the microcomputer 20 operates as diagnosis condition determining means, and the diagnosis mode changing process and the diagnosing process which are executed by the microcomputer 20 operate as abnormality diagnosing means.

The foregoing description of the preferred embodiments of the invention has been presented for purposes of illustration and description. It is not intended to limit the invention to the precise form disclosed, and it will be obvious to those skilled in the art that various changes may be made without departing from the scope of the invention.

For example, although the motor 2 is applied to the drive device which drives the EGR valve that is disposed in the exhaust gas recirculation path of the vehicle engine, the motor 2 may be used to drive any other devices.

Also, although as the execution conditions of the abnormality diagnosis, the rotation state of the motor, the operating state of the object to be driven, and the operating state of the engine and the vehicle are checked, the abnormality diagnosis error that will be caused by the rotation of the motor can be reduced by both or any one of the rotation state of the motor and the operating state of the object to be driven as the execution conditions of the abnormality diagnosis.

What is claimed is:

1. A drive device for a brushless motor, comprising:
a plurality of drive circuits that are connected to a plurality of motor terminals of the brushless motor, respectively, each drive circuit having a pair of switching elements that connects a power supply fine of a DC power supply and a ground line to the motor terminals, respectively;
a plurality of terminal voltage detecting means that detects terminal voltages of the respective motor terminals, respectively; and
abnormality diagnosing means that executes abnormality diagnosis of a motor side circuit after turning off all of the switching elements in the plurality of drive circuits, wherein the abnormality diagnosing means applies a voltage to one of the motor terminals after turning off the switching elements by turning on the switch element on a power supply line side that is disposed in one of the plurality of drive circuits, and takes in the terminal voltages of the respective motor terminals from the respective terminal voltage detecting means as high or low level signals, thereby executing the abnormality diagnosis based on a signal level of the taken terminal voltages.

2. The drive device for a brushless motor according to claim 1, wherein:
the brushless motor is a three-phase brushless motor, which includes a three star-connected windings; and
the switching elements of each of the drive circuits are connected in a half-bridge configuration.

3. The drive device for a brushless motor according to claim 1, wherein:
the abnormality diagnosing means turns on only the switch element on a power supply line side that is disposed in one of the plurality of drive circuits, thereby applying the voltage to one of the motor terminals.

4. A drive device for a brushless motor, comprising:
a plurality of drive circuits that are connected to a plurality of motor terminals of the brushless motor, respectively, each drive circuit having have a pair of switching elements that connects a power supply fine of a DC power supply and a ground line to the motor terminals, respectively;
a plurality of terminal voltage detecting means that detects terminal voltages of the respective motor terminals, respectively;
a rotation sensor that is disposed in the brushless motor;

checking means that checks whether the brushless motor has stopped rotating based on the detection signal of the rotation sensor; and
abnormally diagnosing means that executes abnormality diagnosis of a motor side circuit after turning off all of the switching elements in the plurality of drive circuits, wherein the abnormality diagnosing means applies a voltage to one of the motor terminals after turning off the switching elements and takes in the terminal voltages of the respective motor terminals from the respective terminal voltage detecting means as high or low level signals, thereby executing the abnormality diagnosis based on a signal level of the taken terminal voltages, when the checking means determines that the brushless motor has stopped rotating.

5. The drive device for a brushless motor according to claim 4, wherein:
the abnormality diagnosing means turns on the switch element on a power supply line side that is disposed in one of the plurality of drive circuits, thereby applying the voltage to one of the motor terminals.

6. The drive device for a brushless motor according to claim 4, wherein:
the brushless motor is a three-phase brushless motor, which includes a three star-connected windings; and
the switching elements of each of the drive circuits are connected in a half-bridge configuration.

7. The drive device for a brushless motor according to claim 4, wherein:
the abnormality diagnosing means turns on only the switch element on a power supply line side that is disposed in one of the plurality of drive circuits, thereby applying the voltage to one of the motor terminals.

8. A drive device for a brushless motor, comprising:
a plurality of drive circuits that are connected to a plurality of motor terminals of the brushless motor, respectively, each drive circuit having have a pair of switching elements that connects a power supply line of a DC power supply and a ground line to the motor terminals, respectively;
a plurality of terminal voltage detecting means that detects terminal voltages of the respective motor terminals, respectively;
checking means that checks whether an object to be driven connected to a motor shaft of the brushless motor has operated normally at the time of driving the brushless motor; and
abnormality diagnosing means that executes abnormality diagnosis of a motor side circuit after turning off all of the switching elements in the plurality of drive circuits, wherein the abnormality diagnosing means applies a voltage to one of the motor terminals after turning off the switching elements and takes in the terminal voltages of the respective motor terminals from the respective terminal voltage detecting means as high or low level signals, thereby executing the abnormality diagnosis based on a signal level of the taken terminal voltages, when the checking means determines that the object to be driven has operated normally.

9. The drive device for a brushless motor according to claim 8, further comprising:
a rotation sensor that is disposed in the brushless motor, wherein the checking means further checks whether the brushless motor has stopped rotating based on the detection signal of the rotation sensor, and
wherein the abnormality diagnosing means applies a voltage to one of the motor terminals after turning off the switching elements and takes in the terminal voltages of the respective motor terminals from the respective terminal voltage detecting means, thereby executing the abnormality diagnosis based on the taken terminal voltages, when the checking means further determines that the brushless motor has stopped rotating.

10. The drive device for a brushless motor according to claim 8, wherein:

the abnormality diagnosing means turns on the switch element on a power supply line side that is disposed in one of the plurality of drive circuits, thereby applying the voltage to one of the motor terminals.

11. The drive device for a brushless motor according to claim 8, wherein:

the brushless motor is a three-phase brushless motor, which includes a three star-connected windings; and the switching elements of each of the drive circuits are connected in a half-bridge configuration.

12. The drive device for a brushless motor according to claim 8, wherein:

the abnormality diagnosing means turns on only the switch element on a power supply line side that is disposed in one of the plurality of drive circuits, thereby applying the voltage to one of the motor terminals.

* * * * *